(12) United States Patent
Jisong

(10) Patent No.: US 10,991,596 B2
(45) Date of Patent: Apr. 27, 2021

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventor: Jin Jisong, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/537,100

(22) Filed: Aug. 9, 2019

(65) Prior Publication Data
US 2020/0251348 A1   Aug. 6, 2020

(30) Foreign Application Priority Data
Feb. 2, 2019   (CN) .......................... 201910107770.9

(51) Int. Cl.
*H01L 21/311*   (2006.01)
*H01L 21/033*   (2006.01)
(Continued)

(52) U.S. Cl.
CPC .... *H01L 21/31144* (2013.01); *H01L 21/0276* (2013.01); *H01L 21/0332* (2013.01);
(Continued)

(58) Field of Classification Search
CPC ......... H01L 21/31144; H01L 21/31116; H01L 21/0337; H01L 21/0276; H01L 21/3088;
(Continued)

(56) References Cited

U.S. PATENT DOCUMENTS

| 2017/0256417 A1* | 9/2017 | Chou ................ H01L 21/02164 |
| 2019/0318928 A1* | 10/2019 | Mignot ............... H01L 21/3086 |
| 2019/0318931 A1* | 10/2019 | Shu ...................... H01L 23/5226 |

* cited by examiner

*Primary Examiner* — Duy Vu N Deo
(74) *Attorney, Agent, or Firm* — Brinks Gilson & Lione

(57) ABSTRACT

A semiconductor structure and a method for forming the same are provided. The forming method may include: providing a base; forming, on the base, a to-be-etched material layer, a core material layer located on the to-be-etched material layer, and an HM material layer located on the core material layer; patterning the HM material layer to form HM layers; etching the core material layer between adjacent HM layers, forming a plurality of first grooves exposed from the to-be-etched material layer, and using the remaining core material layer as a core layer; and forming a side wall layer on side walls of the first groove and the HM layer; after the side wall layer is formed, removing the HM layer and the core layer at the bottom of the HM layer, and forming a plurality of second grooves exposed from the to-be-etched material layer; and removing the to-be-etched material layer at the bottom of the first groove and the second groove by using the side wall layer and the remaining core layer as masks, to form a target pattern. In embodiments and implementations of the present disclosure, the pattern precision of the first groove and the second groove is improved. After the target pattern is formed, the pattern precision of the target pattern is correspondingly improved.

13 Claims, 11 Drawing Sheets

(51) Int. Cl.
*H01L 21/027* (2006.01)
*H01L 21/308* (2006.01)
*H01L 21/3213* (2006.01)

(52) U.S. Cl.
CPC ...... *H01L 21/0337* (2013.01); *H01L 21/3086* (2013.01); *H01L 21/3088* (2013.01); *H01L 21/31116* (2013.01); *H01L 21/32139* (2013.01)

(58) Field of Classification Search
CPC ............. H01L 21/3086; H01L 21/0332; H01L 21/32139; H01L 21/768
USPC .......................................... 438/689, 706–714
See application file for complete search history.

US 10,991,596 B2

SEMICONDUCTOR STRUCTURE AND METHOD FOR FORMING SAME

RELATED APPLICATIONS

The present application claims priority to Chinese Patent Appln. No. 201910107770.9, filed Feb. 2, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

With the rapid growth of the semiconductor integrated circuit (IC) industry, process nodes in the semiconductor technology become increasingly small according to Moore's law. Therefore, ICs have increasingly small volumes and become increasingly precise and complex.

In the development of ICs, generally, functional density (that is, the number of interconnected structures per chip) gradually increases while geometric size (that is, the size of the smallest component that can be created using process steps) gradually decreases. Correspondingly, IC manufacturing becomes more difficult and complex.

Currently, as technological nodes become increasingly small, it becomes challenging to enable a pattern formed on a wafer to better match a target pattern.

SUMMARY

The problem to be addressed by embodiments and implementations of the present disclosure is to provide a semiconductor structure and a method for forming the same, to improve pattern precision.

To address the foregoing problem, one form of the present disclosure provides a method for forming a semiconductor structure. The method may include: providing a base; forming, on the base, a to-be-etched material layer, a core material layer located on the to-be-etched material layer, and a hard mask (HM) material layer located on the core material layer; patterning the HM material layer to form a plurality of discrete HM layers; etching the core material layer between adjacent HM layers, forming, in the core material layer, a plurality of first grooves exposing the to-be-etched material layer, and using the remaining core material layer as a core layer; forming a side wall layer on a side wall of the first groove and a side wall of the HM layer; after the side wall layer is formed, removing the HM layer and the core layer at the bottom of the HM layer, and forming, in the core layer, a plurality of second grooves exposing the to-be-etched material layer; and removing the to-be-etched material layer at the bottom of the first groove and the second groove by using the side wall layer and the remaining core layer as masks, and forming a target pattern in the remaining to-be-etched material layer.

Another form of the present disclosure provides a semiconductor structure. The semiconductor structure may include: a base; a to-be-etched material layer, located on the base; a core layer, located on the to-be-etched material layer, where a plurality of grooves exposing the to-be-etched material layer are formed in the core layer; HM layers, arranged discretely on the core layer, where a plurality of openings are formed between adjacent HM layers, the opening and the groove are in communication, and a side wall of the opening is level with a side wall, located between adjacent HM layers, of the groove; and a side wall layer, located on the side wall of the groove and a side wall of the HM layer.

Compared with the prior art, the technical solutions in the embodiments and implementations of the present disclosure have the following advantages.

In some implementations of the present disclosure, after a first groove is formed, a side wall layer is formed on a side wall of the first groove and a side wall of an HM layer; after the side wall layer is formed, the HM layer and the core layer at the bottom of the HM layer are removed, and a plurality of second grooves exposed from a to-be-etched material layer are formed in the core layer. Compared with a solution in which the first groove and the second groove are formed in a same step, in the present disclosure, the first groove and the second groove are separately formed, so that it is less difficult to form the first groove and the second groove, and the process window is increased (for example, optical proximity effects are mitigated), thereby ensuring the pattern precision of the first groove and the second groove. Correspondingly, the to-be-etched material layer at the bottom of the first groove and the second groove are subsequently removed, so that after a target pattern is formed in the remaining to-be-etched material layer, the pattern precision of the target pattern is also improved. Moreover, by using the side wall layer, the first groove is further isolated from the second groove, so that the pitch between the adjacent first groove and second groove has the designed minimum space.

DETAILED DESCRIPTION

As can be seen from the related art, as technological nodes become increasingly small, it becomes challenging to enable a pattern formed on a wafer to better match a target pattern.

It is found through research that the pitch between photoresist patterns keeps decreasing as technological nodes become increasingly small. However, under the influence of a photolithography process, when the pitch between adjacent photolithographic patterns is less than a threshold distance of the photolithography process, the photoresist patterns tend to deform or distort. When the photoresist patterns are transferred to a film layer to be patterned to form a target pattern (for example, an interconnection opening), pattern precision of the target pattern is correspondingly reduced.

To address the technical problem, in embodiments and implementations of the present disclosure, after a first groove is formed, a side wall layer is formed on a side wall of the first groove and a side wall of an HM layer. After the side wall layer is formed, the HM layer and a core layer at the bottom at the HM layer are removed. A plurality of second grooves exposing a to-be-etched material layer is formed in the core layer. Compared with a solution in which the first groove and the second groove are formed in a same step, in the present disclosure, the first groove and the second groove are separately formed, so that it is less difficult to form the first groove and the second groove, and the process window is increased (for example, optical proximity effects are mitigated), thereby ensuring the pattern precision of the first groove and the second groove. Correspondingly, the to-be-etched material layer at the bottom of the first groove and the second groove is removed, so that after a target pattern is formed in the remaining to-be-etched material layer, the pattern precision of the target pattern is correspondingly improved. Moreover, by using the side wall layer, the first groove is further isolated from the second groove, so that the pitch between the adjacent first groove and second groove has the designed minimum space.

To make the foregoing objectives, features, and advantages of embodiments and implementations of the present disclosure more comprehensible, specific embodiments and implementations of the present disclosure are described below in detail with reference to the accompanying drawings.

FIG. 1 to FIG. 22 are schematic structural diagrams corresponding to steps in one form of a method for forming a semiconductor structure.

Figure 1:
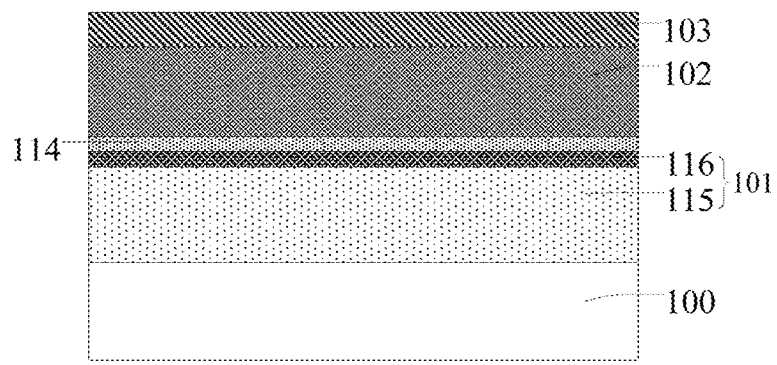
FIG. 1 to FIG. 22 are schematic structural diagrams corresponding to steps in one form of a method for forming a semiconductor structure.

Referring to FIG. 1, a base 100 is provided. The base 100 is used to provide a process platform for a subsequent process. In some implementations, for example, a formed semiconductor structure is a planar transistor. The base 100 includes a substrate (not shown).

Specifically, the substrate is a silicon substrate. In other implementations, the material of the substrate may further be germanium, silicon-germanium, silicon carbide, gallium arsenide or indium gallium phosphide, among other materials. The substrate may further be another type of substrate such as a silicon-on-insulator substrate or a germanium-on-insulator substrate.

In other implementations, when the formed semiconductor structure is a fin field-effect transistor, the base may correspondingly include a substrate and a fin protruding from the substrate.

The base 100 may further include another structure such as a gate structure, a doped region, a shallow trench isolation (STI) structure, and a dielectric layer. The gate structure may be a metal gate structure or a polysilicon gate structure.

In some implementations, the base 100 further includes an inter-layer dielectric layer (not shown) formed on the substrate and a contact (CT) hole plug (not shown) formed in the inter-layer dielectric layer.

Referring to FIG. 1, a to-be-etched material layer 101, a core material layer 102 located on the to-be-etched material layer 101, and a first HM material layer 103 located on the core material layer 102 are formed on the base 100.

The to-be-etched material layer 101 is a material layer that needs to be patterned subsequently to form a target pattern.

In some implementations, the to-be-etched material layer 101 is a stacked structure. The to-be-etched material layer 101 includes a dielectric layer 115 and a second HM material layer 116 located on the dielectric layer 115.

The dielectric layer 115 is used to electrically isolate subsequently formed interconnection structures.

In some implementations, the dielectric layer 115 is an inter metal dielectric (IMD) layer, to provide a process platform for subsequently forming metal interconnection structures. The dielectric layer 115 is further used to electrically isolate metal interconnection structures in a back end of line (BEOL) process.

Specifically, the dielectric layer 115 is a first IMD layer is used to electrically isolate first metal interconnection lines (that is, M1 layers). The first metal interconnection line is a metal interconnection structure closest to a contact hole plug.

In other implementations, the dielectric layer may further be an IMD layer located on the first metal interconnection line and used to electrically isolate other interconnection structures. For example, the dielectric layer is a second IMD layer used to electrically isolate second metal interconnection lines and electrically isolate via structures located between the second metal interconnection line and the first metal interconnection line.

Accordingly, the material of the dielectric layer 115 is a low k dielectric material (the low k dielectric material is a dielectric material having a relative dielectric constant greater than or equal to 2.6 and less than or equal to 3.9), an ultra-low k dielectric material (the ultra-low k dielectric material is a dielectric material having a relative dielectric constant less than 2.6), silicon oxide, silicon nitride, silicon oxynitride or the like.

In some implementations, the material of the dielectric layer 115 is an ultra-low k dielectric material, to reduce a parasitic capacitance between BEOL metal interconnection structures, thereby reducing a BEOL RC delay. Specifically, the ultra-low k dielectric material may be SiOCH.

In other implementations, the dielectric layer may further be an inter-layer dielectric layer, to provide a process platform for subsequently forming a contact hole plug. The inter-layer dielectric layer is further used to isolate adjacent contact hole plugs and isolate the contact hole plug from a gate structure.

The second HM material layer 116 forms a second HM layer after a subsequent patterning process is performed, to provide a mask for subsequently patterning the dielectric layer 115.

The material of the second HM material layer 116 may include one or more of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, and tungsten nitride.

In some implementations, the dielectric layer 115 is an IMD layer. Therefore, the second HM material layer 116 is a metal HM (MHM) material layer. Specifically, the material of the second HM material layer 116 is titanium nitride. The titanium nitride is a common MHM layer material in a BEOL process, and helps to improve the process compatibility.

The core material layer 102 is used to provide a process basis for subsequently forming a core layer.

The material of the core material layer 102 may be silicon, silicon nitride, silicon oxide or titanium oxide. In some implementations, the material of the core material layer 102 is silicon.

The first HM material layer 103 is used to provide a process basis for subsequently forming a patterned first HM layer, to provide an etching mask for patterning the core material layer 102.

The material of the first HM material layer 103 is different from the material of the core material layer 102. In some implementations, the material of the first HM material layer 103 is silicon nitride. An etching selection ratio of silicon nitride to silicon is relatively large, so that it can be ensured that the subsequently formed first HM layer can be used as an etching mask for patterning the core material layer 102.

In other implementations, the material of the first HM material layer may alternatively be another material of which an etching selection ratio to the material of the core material layer is relatively high.

A subsequent process may further include: patterning the first HM material layer 103 to form the first HM layer, patterning the core material layer 103 to form the core layer, and forming, in the core layer, a plurality of first grooves exposing the to-be-etched material layer 101; and forming a side wall layer on side walls of the first groove and the first HM layer, where the side wall layer is used as a mask for subsequently patterning the to-be-etched material layer 101. Therefore, the total thickness of the first HM material layer 103 and the core material layer 102 should not be excessively small. Otherwise, the side wall layer formed on the side walls of the first groove and the first HM layer is correspondingly excessively short. As a result, the side wall layer tends to fail to serve as an etching mask for subsequently patterning the to-be-etched material layer 101. The total thickness of the first HM material layer 103 and the core material layer 102 should not be excessively large either. Otherwise, process materials tend to be wasted. Correspondingly, it also takes a relatively long time to pattern the first HM material layer 103 and the core material layer 102, and production capacity may be reduced as a result. Moreover, after the side wall layer is formed subsequently, the first HM layer and the core layer at the bottom of the first HM layer are further removed. If the total thickness is excessively large, correspondingly, the side wall layer is excessively high as a result, and the side wall layer is more likely to collapse. Accordingly, in some implementations, the total thickness of the first HM material layer 103 and the core material layer 102 is 400 angstroms to 1000 angstroms.

Specifically, to ensure subsequent normal pattern transfer and improve the precision of pattern transfer, the thickness of the first HM material layer 103 is 200 angstroms to 700 angstroms, and the thickness of the core material layer 102 is 200 angstroms to 700 angstroms.

In some implementations, after the to-be-etched material layer 101 is formed on the base 100, and before the core material layer 102 is formed on the to-be-etched material layer 101, the method further includes: forming an etch stop layer 114 (as shown in FIG. 1) on the to-be-etched material layer 101.

Subsequently, the core material layer 102 is patterned in different steps, so that the first groove and a second groove that expose the to-be-etched material layer 101 are separately formed. The etch stop layer 114 can define an etch stop position in the step of forming the first groove and the second groove, so that while it is ensured that both the first groove and the second groove can expose the to-be-etched material layer 101, the loss of the to-be-etched material layer 101 is reduced.

In some implementations, the material of the etch stop layer 114 is silicon oxide. Selection ratios of silicon oxide to both silicon nitride and silicon are relatively high, so that it can be ensured that the etch stop layer 114 can define an etch stop position in the subsequent step of etching the core material layer 102.

In other implementations, according to the materials of the core material layer used in an actual process and the subsequent formed side wall layer, the material of the etch stop layer may alternatively be another material of which selection ratios to the materials of the core material layer, the side wall layer, and the to-be-etched material layer are relatively high, and is, for example, silicon nitride, silicon carbide, aluminum oxide or nitride doped carbon (NDC).

Figure 3:
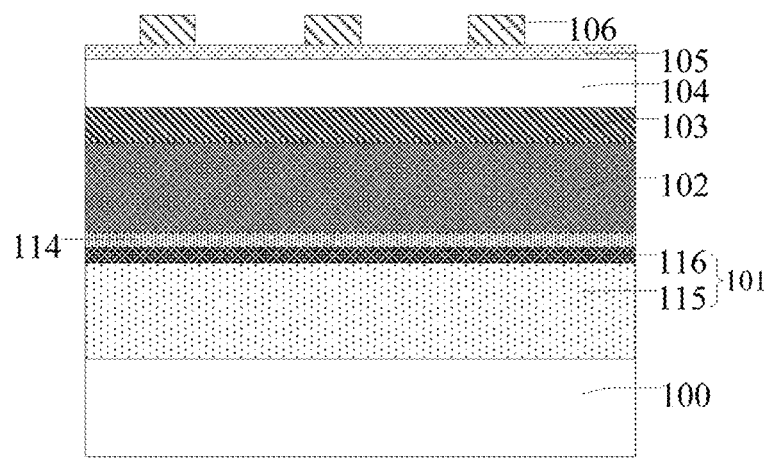
Figure 4:
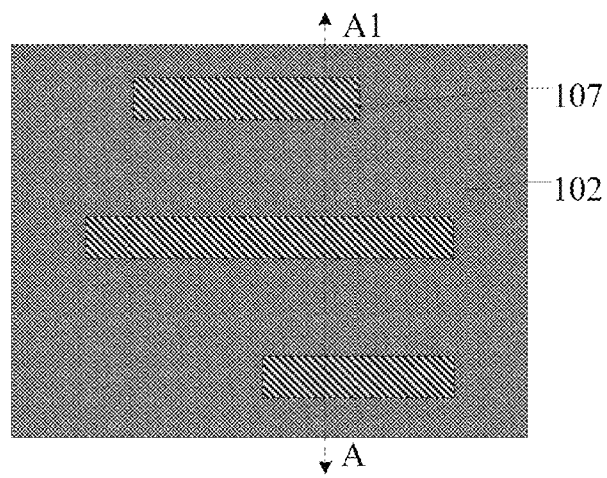
Figure 5:
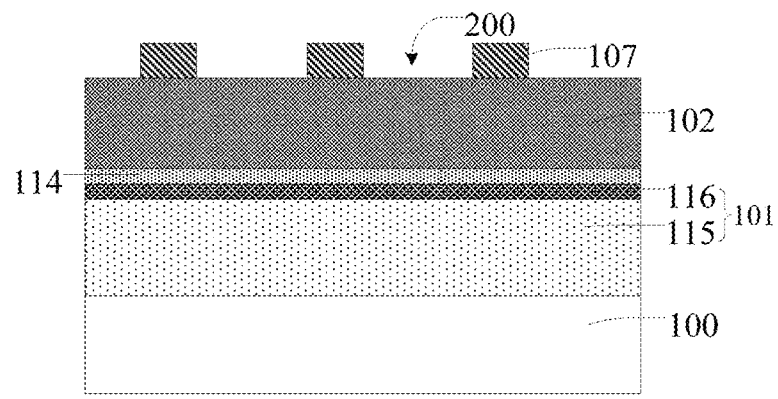

Referring to FIG. 2 to FIG. 5, the first HM material layer 103 (as shown in FIG. 1) is patterned, and a plurality of discrete first HM layers 107 (as shown in FIG. 5) are formed.

The first HM layer 107 is used to define a formation region for the second groove that is subsequently formed in the core material layer 102. A region between adjacent first HM layers 107 is further used to define a partial formation region for the subsequent first groove. Moreover, the first HM layer 107 is further used to provide a process platform for subsequently forming the side wall layer.

Accordingly, the topography, size, and formation position of the first HM layer 107 are determined according to the topographies, sizes, and formation positions of the first groove and the second groove, that is, determined according to an IC design.

In some implementations, extension directions of the plurality of first HM layers 107 are the same, and in a direction perpendicular to the extension direction of the first HM layer 107, the plurality of first HM layers 107 are arranged in parallel.

Specifically, the step of patterning the first HM material layer 103 includes the following step.

Figure 2:
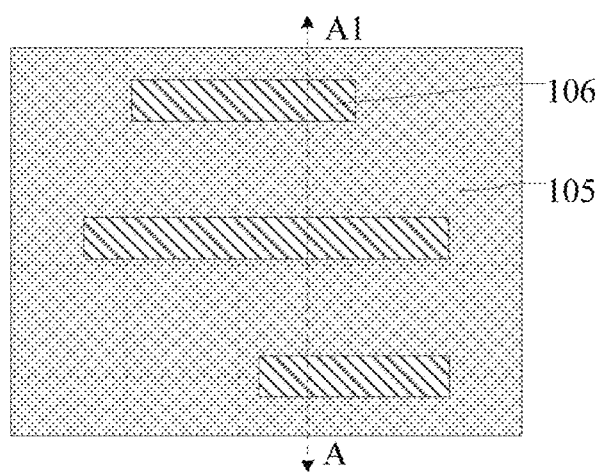

FIG. 2 is a top view, and FIG. 3 is a sectional view in a direction AA1 in FIG. 2. A first pattern layer 106 is formed on the first HM material layer 103.

The first pattern layer 106 is used as a mask for patterning the first HM material layer 103.

In some implementations, the material of the first pattern layer 106 is a photoresist, and a process of forming the first pattern layer 106 is correspondingly a photolithography process.

With reference to FIG. 3, in some implementations, the method further includes: before the first pattern layer 106 is formed on the first HM material layer 103, forming a first flattened layer 104 on the first HM material layer 103; and forming a first anti-reflective coating 105 on the first flattened layer 104. The first pattern layer 106 is correspondingly formed on the first anti-reflective coating 105.

The first flattened layer 104 is used to provide a flat surface for forming the first pattern layer 106, thereby improving the pattern precision of the first pattern layer 106, so that the topography, size, and formation position of the first pattern layer 106 satisfy process requirements. In some implementations, the material of the first flattened layer 104 is a spin-on-carbon (SOC) material.

In other implementations, the material of the first flattened layer 104 may further be an organic dielectric layer (ODL) material or a deep ultraviolet light absorbing oxide (DUO) material.

The first anti-reflective coating 105 is used to mitigate a reflection effect during exposure, thereby improving the precision of pattern transfer. In some implementations, the first anti-reflective coating 105 is a Si-ARC layer. The Si-ARC layer helps to increase the exposure depth of field (DOF) during a photolithography process, thereby helping to improve exposure uniformity. Moreover, the Si-ARC layer is rich in silicon, and therefore further helps to increase the hardness of the first anti-reflective coating 105, thereby helping to further improving the precision of pattern transfer.

In other implementations, the first anti-reflective coating may further be another suitable anti-reflective material, for example, a bottom anti-reflective coating (BARC) material.

FIG. 4 is a top view, and FIG. 5 is a sectional view in a direction AA1 in FIG. 4. The first HM material layer 103 (as shown in FIG. 3) is etched by using the first pattern layer 106 (as shown in FIG. 3) as a mask.

After the first HM material layer 103 is patterned to form the first HM layer 107 (as shown in FIG. 5), a plurality of openings 200 (as shown in FIG. 5) are formed between adjacent first HM layers 107, so as to provide a process basis for subsequently etching the core material layer 102 between adjacent first HM layers 107.

In some implementations, the first HM material layer 103 is etched by using a dry etching process. The dry etching process has an anisotropic etching characteristic, thereby improving the precision of pattern transfer.

In some implementations, the first flattened layer 104 and the first anti-reflective coating 105 located on the first flattened layer 104 are further formed on the first HM material layer 103. Therefore, before the HM material layer 103 is etched, the method further includes: sequentially etching the first anti-reflective coating 105 and the first flattened layer 104 using the first pattern layer 106 as a mask.

In some implementations, in the step of etching the first HM material layer 103, the first pattern layer 106 and the first anti-reflective coating 105 are gradually consumed and are eventually completely etched away.

Correspondingly, after the first HM layer 107 is formed, the forming method further includes: removing the first flattened layer 104. Specifically, the first flattened layer 104 may be removed by using a dry or wet etching process.

Figure 7:
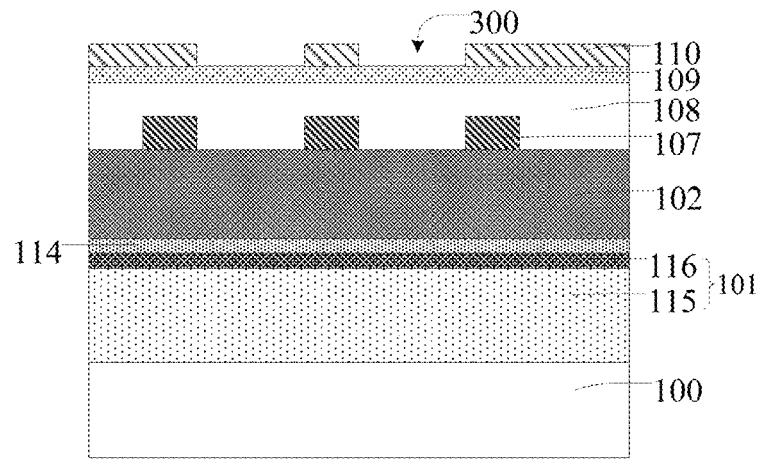
Figure 8:
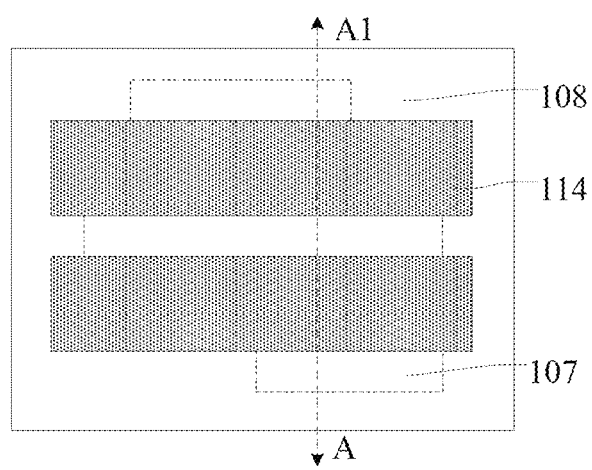
Figure 9:
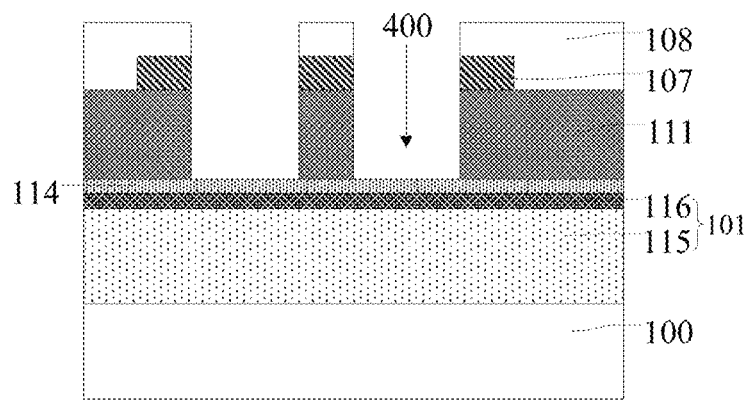

Referring to FIG. 6 to FIG. 9, the core material layer 102 between adjacent first HM layers 107 is etched (as shown in FIG. 5), a plurality of first grooves 400 exposing the to-be-etched material layer 101 are formed in the core material layer 102 (as shown in FIG. 9), and the remaining core material layer 102 is used as a core layer 111 (as shown in FIG. 9).

The first groove 400 is used to provide a process platform for subsequently forming the side wall layer. The first groove 400 is further used to define a partial region to be etched in the to-be-etched material layer 101. Specifically, the first groove 400 exposes the second HM material layer 116.

Moreover, the position of an opening 200 (as shown in FIG. 5) formed between adjacent first HM layers 107 is used to define a partial formation region of the first groove 400. Therefore, the first groove 400 is formed by etching the core material layer 102 between adjacent first HM layers 107, so that it is less difficult to form the first groove 400, and the process window is increased.

Specifically, the step of etching the core material layer 102 between adjacent first HM layers 107 includes the following steps.

Figure 6:
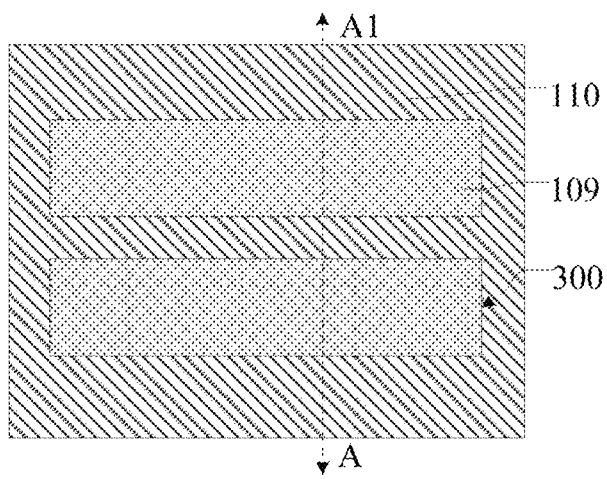

FIG. 6 is a top view, and FIG. 7 is a sectional view in a direction AA1 in FIG. 6. A second flattened layer 108 is formed on the core material layer 102 exposed from the first HM layer 107. The second flattened layer 108 covers the top of the first HM layer 107. A second pattern layer 110 is formed on the second flattened layer 108. The second pattern layer 110 has a plurality of opening patterns 300, and a side wall of an opening pattern 300 located between adjacent first HM layers 107 is level with a side wall of the opening 200.

The second pattern layer 110 is used as a mask for subsequently etching the core material layer 102 to form the first groove. Therefore, the topography, size, and formation position of the second pattern layer 110 are determined according to the topography, size, and formation position of the first groove, that is, determined according to an IC design.

The second flattened layer 108 is used to provide a flat surface for forming the second pattern layer 110.

In some implementations, after the second flattened layer 108 is formed, and before the second pattern layer 110 is formed, the method further includes: forming a second anti-reflective coating 109 on the second flattened layer 108.

The second anti-reflective coating 109 is used to mitigate a reflection effect in an exposure step of forming the second pattern layer 110.

Refer to the foregoing description of the first pattern layer 106, the first flattened layer 104 for the detailed description of the second pattern layer 110, the second flattened layer 108, the second anti-reflective coating 109, and the first anti-reflective coating 105, and details are not described herein again.

It should be noted that in other implementations, an opening pattern located between adjacent HM layers exposes the second flattened layer above the opening and above a part of the top of first HM layers on two sides of the opening. That is, the size of the opening pattern is greater than the size of the opening, so that it is less difficult to form the second pattern layer, and the process window is increased.

FIG. 8 is a top view, and FIG. 9 is a sectional view in a direction AA1 in FIG. 8. The second anti-reflective coating 109, the second flattened layer 108, and the core material layer 102 are sequentially etched along the opening pattern (as shown in FIG. 300).

In some implementations, the second anti-reflective coating 109, the second flattened layer 108, and the core material layer 102 are sequentially etched by using a dry etching process, so that the cross section of the first groove 400 satisfies process requirements.

Because a selection ratio of the first HM layer 107 to the core material layer 102 is relatively high, if the side wall of the opening pattern 300 is not level with the side wall of the opening 200, that is, if the opening pattern 300 exposes the second flattened layer 108 above the opening 200 and above a part of the top of the first HM layers 107 on two sides of the opening 200, the first HM layer 107 can produce a blocking effect in the process of etching the core material layer 102, so that only the core material layer 102 between adjacent first HM layers 107 is etched.

In some implementations, in the step of etching the core material layer 102, the second pattern layer 110 and the second anti-reflective coating 109 are gradually consumed and are eventually completely etched away.

Figure 10:
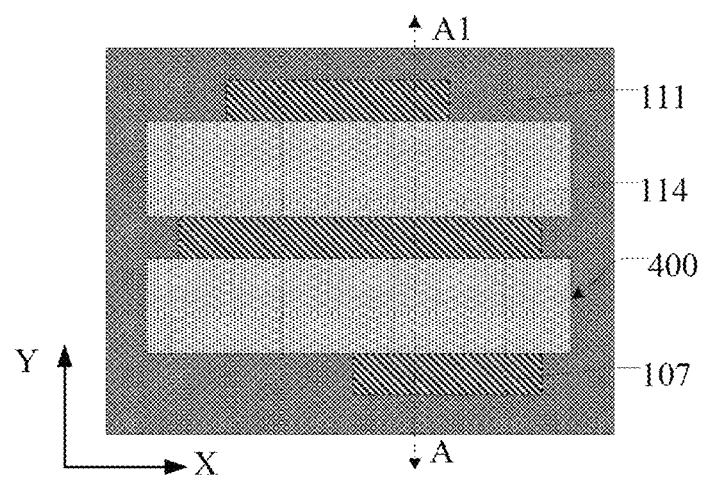
Figure 11:
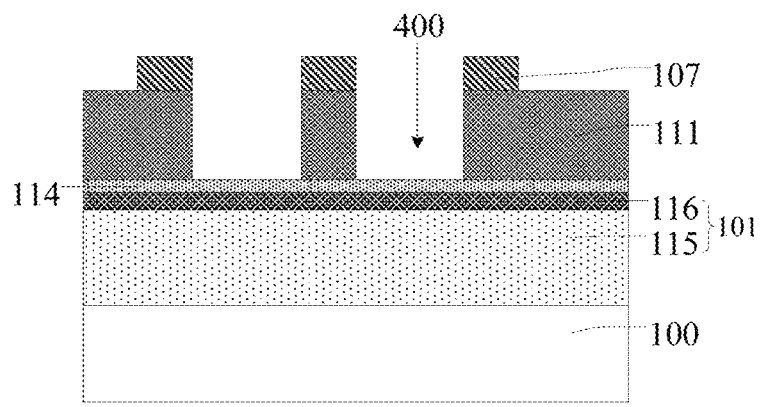

Therefore, FIG. 10 is a top view, and FIG. 11 is a sectional view in a direction AA1 in FIG. 10. After the first groove 400 is formed, the forming method further includes: removing the second flattened layer 108 to expose the first HM layer 107, so as to provide a process platform for subsequently forming the side wall layer on side walls of the first groove 400 and the first HM layer 107.

It should be noted that with reference to FIG. 10, in some implementations, for example, the top-view pattern of the first groove 400 is rectangular. An extension direction of the first groove 400 is the same as the extension direction (the direction X shown in FIG. 10) of the first HM layer 107. In the extension direction of the first HM layer 107, the length of the first groove 400 is greater than the length of the first HM layer 107. Moreover, the widths (in the direction Y shown in FIG. 10) of the first grooves 400 are all equal.

However, the formation position, size, and topography of the first groove 400 are not only limited to the foregoing cases. In other implementations, according to actual requirements of an IC design, the top-view pattern of the first groove may further have an irregular shape. For example, in the direction Y in FIG. 10, compared with a part of the first groove located between adjacent first HM layers, the remaining first groove in another region has a larger width. Alternatively, two ends of adjacent first grooves are connected. That is, the first groove surrounds the first HM layer. The side wall layer is subsequently formed on the side walls of the first groove and the first HM layer, and after the first HM layer and the core layer at the bottom of the first HM layer are removed to form the second grooves, the first groove and the second groove can also be isolated by the side wall layer. Subsequently, pattern transfer is performed to form an interconnection opening in the dielectric layer. After interconnection structures are formed in the interconnection opening, adjacent interconnection structures can also be isolated from each other, so as to prevent the interconnection structures from short circuiting.

Figure 12:
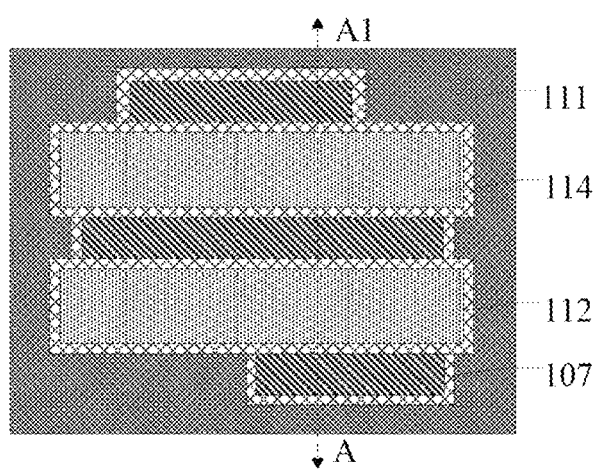
Figure 13:
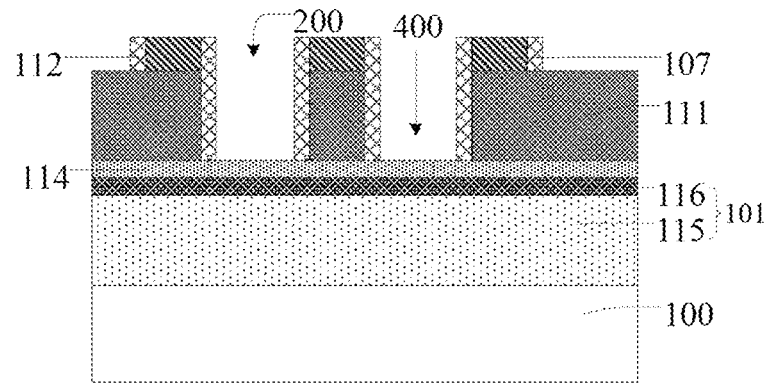

FIG. 12 is a top view, and FIG. 13 is a sectional view in a direction AA1 in FIG. 12. A side wall layer 112 is formed on the side wall of the first groove 400 and the side wall of the first HM layer 107.

A subsequent process further includes: removing the first HM layer 107 and the core layer 111 at the bottom of the first HM layer 107, and forming, in the core layer 111, a plurality of second grooves exposing the to-be-etched material layer 101, where the first groove 400 is formed in the foregoing step. Compared with a solution in which the first groove and the second groove are formed in a same step, in some implementations of the present disclosure, the first groove 400 and the second groove are separately formed, so that it is less difficult to form the first groove 400 and the second groove, and the process window is increased (for example, optical proximity effects are mitigated), thereby ensuring the pattern precision of the first groove 400 and the second groove. Correspondingly, the to-be-etched material layer 101 at the bottom of the first groove 400 and the second groove is subsequently removed, so that after a target pattern is formed in the remaining to-be-etched material layer 101, the pattern precision of the target pattern is also improved. Moreover, by using the side wall layer 112, the first groove 400 is further isolated from the second groove, so that the pitch between the adjacent first groove 400 and second groove has the designed minimum space.

The material of the side wall layer 112 may be titanium oxide, titanium nitride or silicon oxide. In some implementations, the material of the side wall layer 112 is titanium oxide. Etching selection ratios of titanium oxide to silicon, silicon nitride, and SiOCH are all relatively large. The side wall layer 112 can be kept in the subsequent step of removing the first HM layer 107 and the core layer 111 at the bottom of the first HM layer 107. Subsequently, the to-be-etched material layer 101 at the bottom of the first groove 400 and the second groove can be removed by using the side wall layer 112 and the remaining core layer 111 as masks.

Specifically, the step of forming the side wall layer 112 includes: forming a side wall material layer (not shown), where the side wall material layer conformally covers the bottom and the side wall of the first groove 400, the top and the side wall of the first HM layer 107, and the top of the core layer 111 exposed from the first HM layer 107; removing the side wall material layer located at the bottom of the first groove 400, the top of the first HM layer 107, and the top of the core layer 111 exposed from the first HM layer 107. The remaining side wall material layer located on the side wall of the first groove 400 and the side wall of the first HM layer 107 are kept as the side wall layer 112.

In some implementations, the side wall material layer is formed using an atomic layer deposition process. The atomic layer deposition process is chosen to help to improve the thickness uniformity of the side wall material layer, so that the thickness of the side wall layer 112 can be precisely controlled. Moreover, the atomic layer deposition process has desirable spacing filling performance and step coverage performance, so that the conformal coverage capability of the side wall material layer is correspondingly improved. In other implementations, according to an actual process, the side wall material layer may further be formed by using a chemical vapor deposition process.

Correspondingly, in some implementations, because the side wall material layer conformally covers the bottom and the side wall of the first groove 400, the top and the side wall of the first HM layer 107, and the top of the core layer 111 exposed from the first HM layer 107, in some implementations, the side wall material layer located at the bottom of the first groove 400, the top of the first HM layer 107, and the top of the core layer 111 exposed from the first HM layer 107 may be removed using a maskless etching process. A mask does not need to be used in the step of forming the side wall layer 112, so that process costs are reduced.

Specifically, the maskless etching process is performed using a maskless dry etching process. The dry etching process has an anisotropic etching characteristic, so that while it is ensured that the side wall material layer located at the bottom of the first groove 400, the top of the first HM layer 107, and the top of the core layer 111 exposed from the first HM layer 107 are completely removed, damage inflicted to the structure of other film layers is reduced. Moreover, the side wall layer 112 is favorably prevented from becoming thinner because the side wall material layer is transversely etched, thereby ensuring that the side wall layer 112 can serve as an etching mask in the subsequent step of forming a target pattern.

Figure 17:
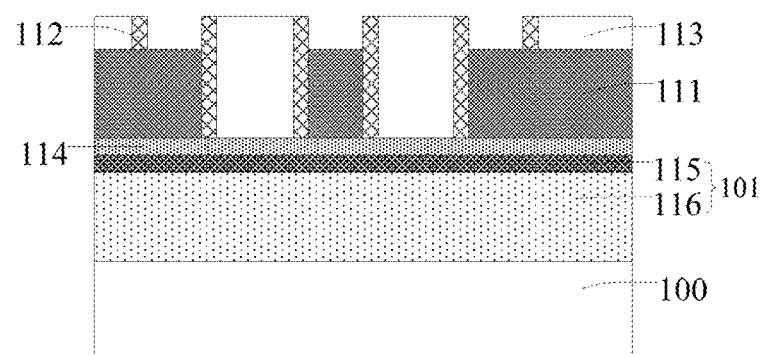
Figure 18:
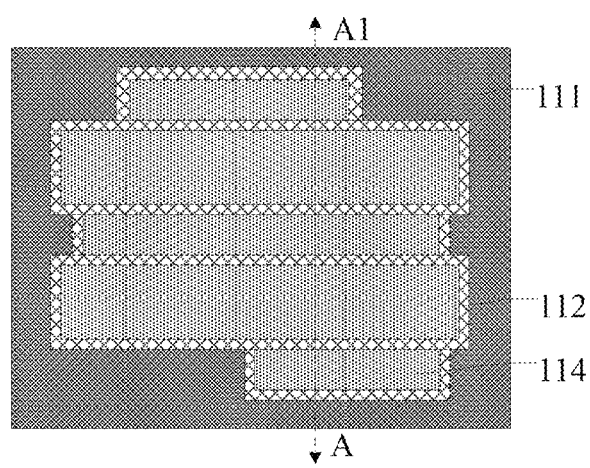
Figure 19:
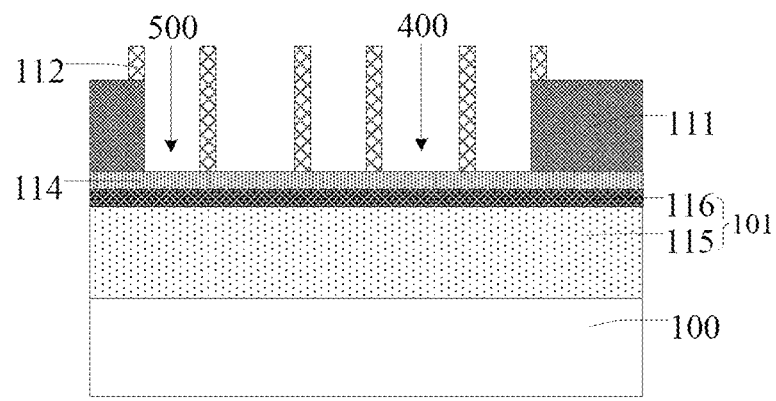

Referring to FIG. 14 to FIG. 19, after the side wall layer 112 are formed, the first HM layer 107 and the core layer 111 at the bottom of the first HM layer 107 are removed, and a plurality of second grooves 500 (as shown in FIG. 19) exposing the to-be-etched material layer 101 are formed in the core layer 111.

The second groove 500 is used to define a remaining region to be etched subsequently in the to-be-etched material layer 101.

As can be known from the foregoing analysis, the first groove 400 and the second groove 500 are separately formed in different steps in some implementations. Therefore, both the first groove 400 and the second groove 500 have relatively high pattern precision, and the pattern precision of a subsequently formed target pattern is correspondingly improved.

Moreover, by using the side wall layer 112, the first groove 400 is isolated from the second groove 500, and the pitch between the adjacent first groove 400 and second groove 500 easily has the designed minimum space.

The step of forming the second groove 500 in some implementations is described below in detail with reference to the accompanying drawings.

Figure 14:
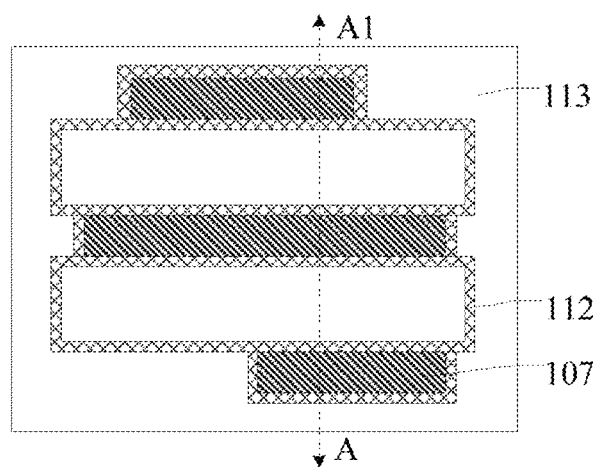
Figure 15:
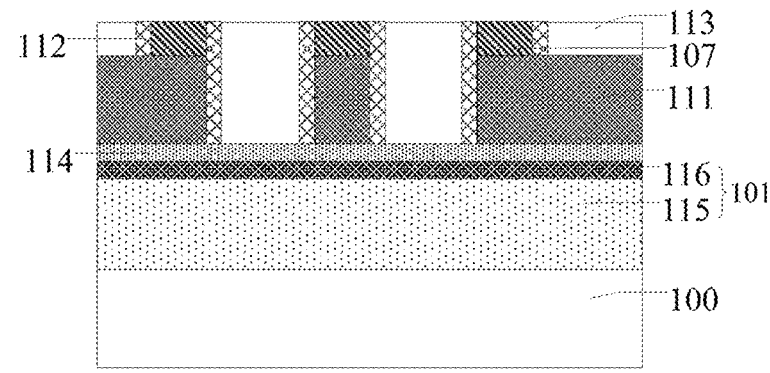

FIG. 14 is a top view, and FIG. 15 is a sectional view in a direction AA1 in FIG. 14. A passivation layer 113 is formed on the first HM layer 107, the core layer 111 exposed from the side wall layer 112, and the to-be-etched material layer 101, the passivation layer 113 exposes the top of the first HM layer 107.

The passivation layer 113 is used to protect the core layer 111 that is not covered by the side wall layer 112 and the first HM layer 107 and the to-be-etched material layer 101 in the subsequent step of removing the first HM layer 107 and the core layer 111 at the bottom of the first HM layer 107.

In some implementations, the material of the passivation layer 113 is SOC, so that the process of forming and subsequently removing the passivation layer 113 becomes less difficult, and the semiconductor structure is less affected by the passivation layer 113.

In other implementations, the material of the passivation layer may further be an ODL material, a BARC material, a DUO material or a dielectric anti-reflective coating (DARC) material.

Specifically, the step of forming the passivation layer 113 includes: forming a passivation material layer (not shown) on the side wall layer 112 and the core layer 111 exposed from the first HM layer 107. The passivation material layer is filled in the first groove 400 and covers the top of the first HM layer 107. The passivation material layer is etched back by a partial thickness, and the remaining passivation material layer is kept as the passivation layer.

In some implementations, the passivation material layer is formed by using a spin coating process. The spin coating process is simple and readily operable, and helps to improve the process compatibility and production capacity.

In some implementations, by using a dry etching process, the passivation material layer is etched back by a partial thickness, so that the removal thickness of the passivation material layer can be precisely controlled.

As shown in FIG. 16 to FIG. 19, the first HM layer 107 and the core layer 111 at the bottom of the first HM layer 107 are sequentially removed by using the passivation layer 113 and the side wall layer 112 as masks, and the second groove 500 (as shown in FIG. 19) exposing the to-be-etched material layer 101 is formed in the core layer 111.

In some implementations, after the first HM layer 107 is removed, the exposed core layer 111 is a region to be etched. Compared with a solution in which a photolithography process is directly used to form a pattern layer and the pattern layer is then used as a mask to pattern the core layer to form the second groove, a mask does not need to be used in the step of forming the second groove 500 in some implementations, thereby reducing process costs. Moreover, the region to be etched in the core layer 111 may be exposed by removing the first HM layer 107, so that the process of forming the second groove 500 becomes less difficult, and the process window is increased.

Figure 16:
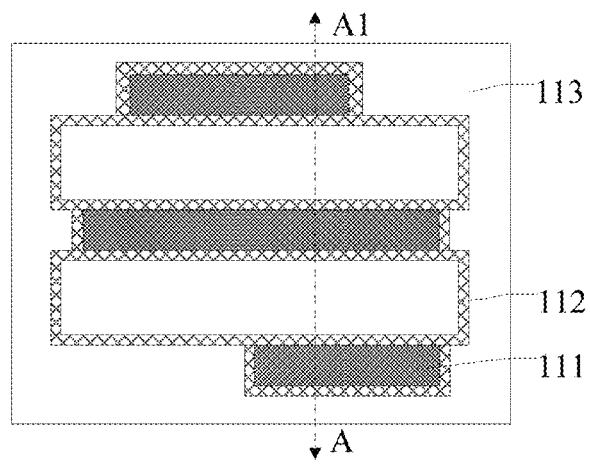

FIG. 16 is a top view, and FIG. 17 is a sectional view in a direction AA1 in FIG. 16. In some implementations, the material of the first HM layer 107 is silicon nitride. A wet etching process is used to remove the first HM layer 107. Specifically, a phosphonic acid solution is used to perform the wet etching process. The wet etching process is a common etching process for removing silicon nitride, and has a relatively low process risk and a relatively high removal rate.

In other implementations, when the material of the first HM layer is silicon, the first HM layer may be removed using a dry etching process (for example, a plasma etching process) or a wet etching process (for example, a TMAH solution or an AMMONIA solution is used to perform the wet etching process). In other implementations, when the material of the first HM layer is another material, a suitable etching process is correspondingly selected to remove the first HM layer. The TMAH solution is a mixed solution that contains tetramethylammonium hydroxide and water, and the AMMONIA solution is a mixed solution of ammonium hydroxide and water.

With reference to FIG. 18 to FIG. 19, in some implementations, the material of the core layer 111 is silicon. After the first HM layer 107 is removed, the core layer 111 between adjacent side wall layers 112 is removed by using a dry etching process.

The dry etching process is chosen to help to improve the quality of the cross section of the formed second groove 500.

Referring to FIG. 18 to FIG. 19, it should be noted that the method may further include: after the second groove 500 is formed, removing the passivation layer 113 to expose the first groove 400 and the to-be-etched material layer 101 at the bottom of the first groove 400, so as to provide a process basis for subsequently removing the to-be-etched material layer 101 at the bottom of the first groove 400 and the second groove 500. Specifically, the passivation layer 113 is removed using a dry etching process or an ashing process.

Figure 20:
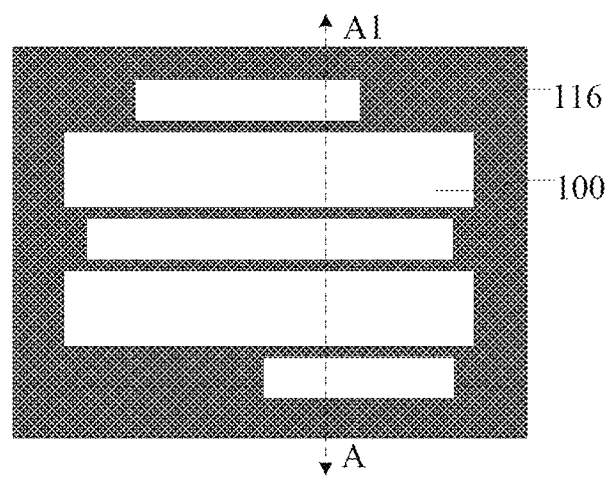
Figure 21:
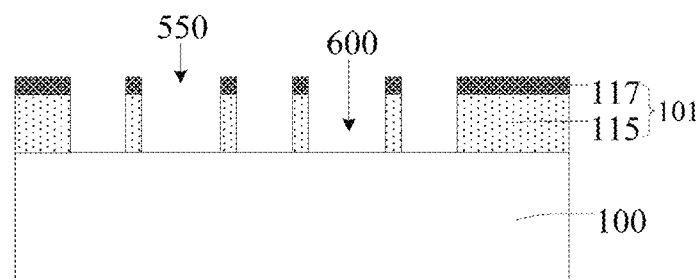

FIG. 20 is a top view, and FIG. 21 is a sectional view in a direction AA1 in FIG. 20. The to-be-etched material layer 101 at the bottom of the first groove 400 and the second groove 500 are removed using the side wall layer 112 and the remaining core layer 111 as masks, and a target pattern is formed in the remaining to-be-etched material layer 101.

After the to-be-etched material layer 101 at the bottom of the first groove 400 and the second groove 500 is removed, the patterns of the first groove 400 and the second groove 500 are transferred to the remaining to-be-etched material layer 101 to form a target pattern. The first groove 400 and the second groove 500 have relatively high pattern precision, so that the pattern precision of the target pattern is correspondingly improved.

In some implementations, the to-be-etched material layer 101 includes the dielectric layer 115 and the second HM material layer 116 located on the dielectric layer 115. Therefore, the step of forming the target pattern in the remaining to-be-etched material layer 101 includes: removing the second HM material layer 116 at the bottom of the first groove 400 and the second groove 500 using the side wall layer 112 and the remaining core layer 111 as masks, and forming a mask opening 550 in the remaining second HM material layer 116, where the remaining second HM material layer 116 is used as a second HM layer 117; etching the dielectric layer 115 along the mask opening 550 using the second HM layer 117 as a mask, and forming a plurality of interconnection openings 600 in the dielectric layer. Correspondingly, the pattern precision of the mask opening 550 and the interconnection opening 600 is also improved.

In some implementations, after the second HM material layer 116 is formed, the side wall layer 112 and the remaining core layer 111 are kept, so that the side wall layer 112 and the remaining core layer 111 continue to serve as masks for etching the dielectric layer 115.

Therefore, after the interconnection opening 600 is formed, the method further includes: removing the side wall layer 112 and the remaining core layer 111.

In other implementations, the side wall layer and the remaining core layer may alternatively be removed after the second HM layer is formed.

It should be noted that the etch stop layer 114 is formed on the second HM material layer 116. Therefore, the method further includes: before the second HM material layer 116 at the bottom of the first groove 400 and the second groove 500 is removed, removing the etch stop layer 114 at the bottom of the first groove 400 and the second groove 500. Correspondingly, after the interconnection opening 600 is formed, the method further includes: removing the remaining etch stop layer 114.

In some implementations, the side wall layer 112, the remaining core layer 111, and the remaining etch stop layer 114 are removed using a dry etching process. By adjusting parameters of the dry etching process, the side wall layer 112, the remaining core layer 111, and the remaining etch stop layer 114 can be removed on the same etching machine.

Figure 22:
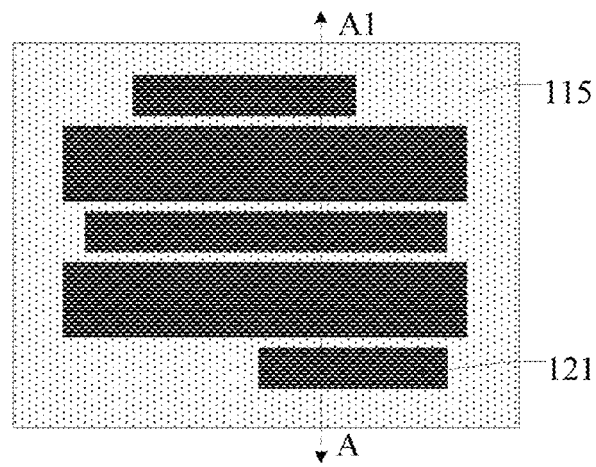

FIG. 22 is a top view based on FIG. 20. The forming method further includes: forming an interconnection structure 121 in the interconnection opening 600 (as shown in FIG. 21).

The interconnection opening 600 has relatively high pattern precision, so that the topography and layout of the interconnection structure 121 satisfy design requirements, and the performance of the interconnection structure 121 is correspondingly improved.

In some implementations, the interconnection structure 121 is a metal interconnection line in a BEOL process.

As the circuit integration level increases, it becomes increasingly complex to design BEOL metal wiring, and the pitch between adjacent metal interconnection lines keeps decreasing. By using the foregoing manner of forming the first groove 400 and the second groove 500, the formation quality and performance of the metal interconnection lines are significantly improved, so that while adjacent metal interconnection lines become less likely to short circuit, the pitch between adjacent metal interconnection lines has the designed minimum space, thereby improving the performance and reliability of the semiconductor structure. Specifically, the metal interconnection line is a first metal (M1) interconnection line.

In other implementations, when the dielectric layer is an inter-layer dielectric layer, the interconnection structure is correspondingly a contact hole plug.

It should be noted that the process of forming the interconnection structure 121 usually includes a flattening treatment step. In some implementations, the second HM layer 117 (as shown in FIG. 21) is removed in the flattening treatment step. In other implementations, the second HM layer may alternatively be removed before the interconnection structure is formed.

Figure 23:
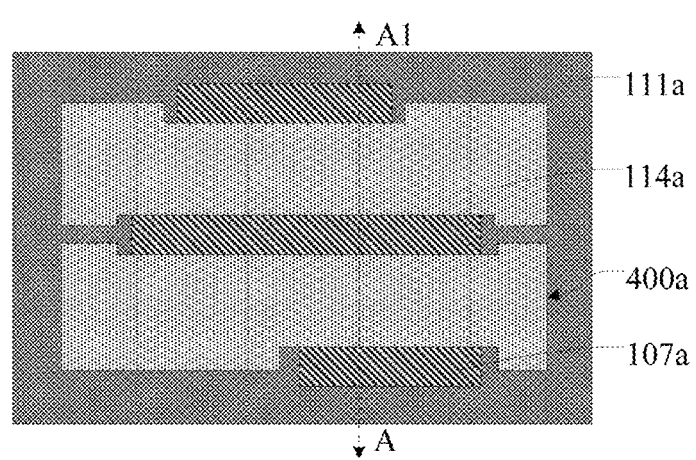
FIG. 23 to FIG. 25 are schematic structural diagrams corresponding to steps in another form of a method for forming a semiconductor structure.
Figure 24:
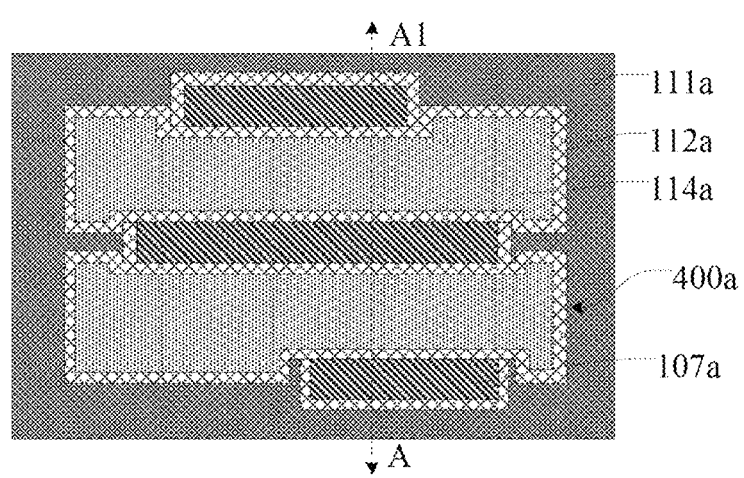
Figure 25:
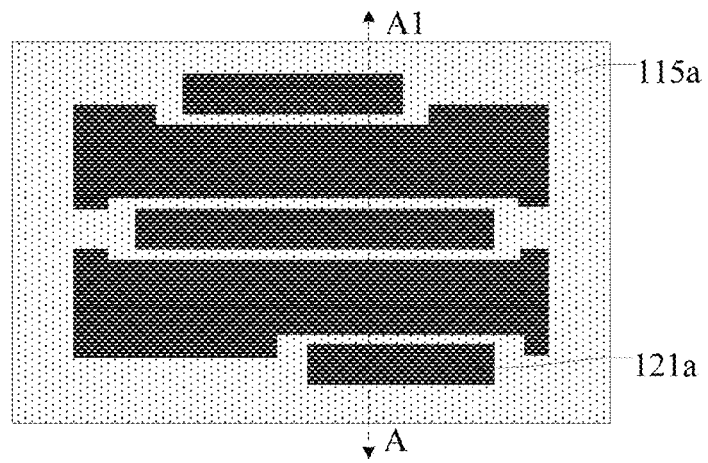

FIG. 23 to FIG. 25 are schematic structural diagrams corresponding to steps in other implementations of a method for forming a semiconductor structure.

For the same content in some implementations and the foregoing embodiment, details are not described herein again. A difference between some implementations and the foregoing embodiment lies in that the formation position, size, and topography of a first groove 400a are different from those in the foregoing embodiment.

Referring to FIG. 23, after the first groove 400a exposing an etch stop layer 114a is formed in a core layer 111a, in a direction perpendicular to an extension direction of a first HM layer 107a, for a same first groove 400a, compared with a part located between adjacent first HM layers 107a, the remaining part has a larger width.

In some implementations, the first groove 400a is not only located between adjacent first HM layers 107a, but also in the extension direction of the first HM layer 107a, the first groove 400a extends to two sides of the first HM layer 107a, that is, the first groove 400a surrounds a part of a side wall of the first HM layer 107a, to satisfy actual requirements of an IC design.

Referring to FIG. 24, a side wall layer 112a is formed on a side wall of the first groove 400a and the side wall of the first HM layer 107a.

After the first HM layer 107a and the core layer (not shown) at the bottom of the first HM layer 107a are subsequently removed to form the second grooves, the first groove 400a and the second groove can be isolated by the side wall layer 112a.

Subsequent steps are the same as those in the foregoing implementations, and details are not described herein again.

Correspondingly, FIG. 25 is a schematic diagram of forming an interconnection structure 121a in an interconnection opening in a dielectric layer 115a, and adjacent interconnection structures 121a are isolated from each other, thereby preventing the interconnection structure 121a from short circuiting. Moreover, the pitch between adjacent interconnection structures 121a still easily has the designed minimum space. In addition, the layout of the interconnection structure 121a can satisfy requirements of an IC design.

Figure 26:
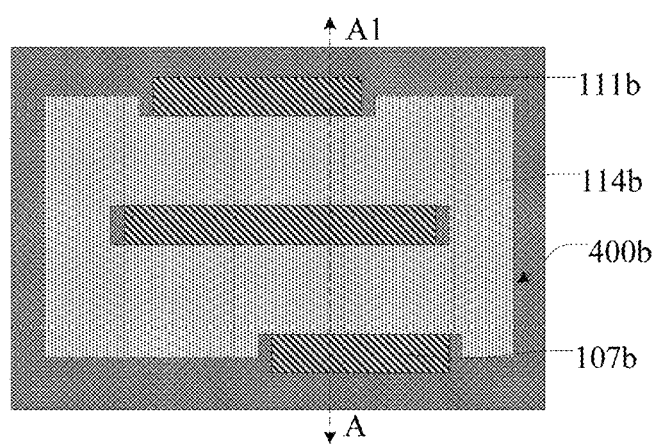
FIG. 26 to FIG. 28 are schematic structural diagrams corresponding to steps in yet another form of a method for forming a semiconductor structure.
Figure 27:
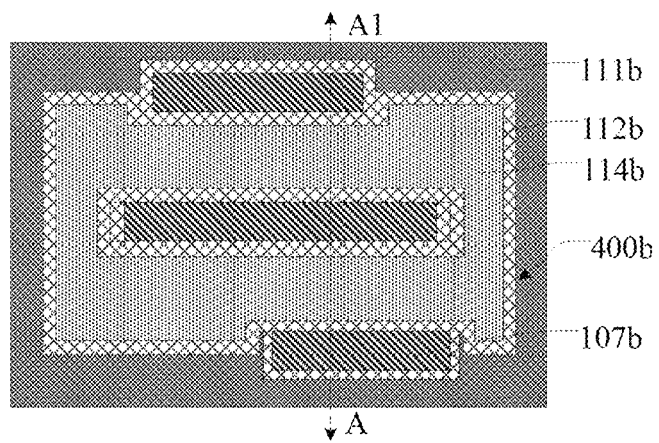
Figure 28:
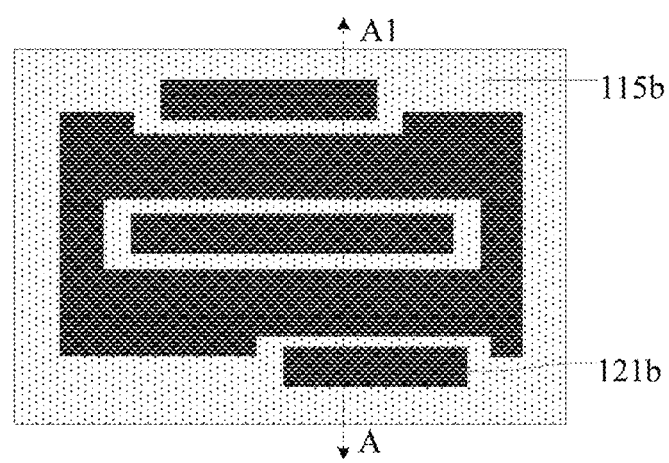

FIG. 26 to FIG. 28 are schematic structural diagrams corresponding to steps in yet other implementations of a method for forming a semiconductor structure.

For the same content in some implementations and the foregoing embodiment, details are not described herein again. A difference between presently described implementations and implementations described above lies in that the formation position, size, and topography of a first groove 400b are different from those in the implementations described above.

Referring to FIG. 26, after the first groove 400b exposing an etch stop layer 114b is formed in a core layer 111b, in a direction perpendicular to an extension direction of a first HM layer 107b, after the first groove 400b exposing the etch stop layer 114b is formed, in a same first groove 400b, compared with a part located between adjacent first HM layers 107b, the remaining part has a larger width. Moreover, two ends of adjacent first grooves 400b are connected. That is, the first groove 400b surrounds the first HM layer 107b.

The first groove 400b surrounds the first HM layer 107b, so as to satisfy actual requirements of an IC design.

Referring to FIG. 27, a side wall layer 112b is formed on a side wall of the first groove 400b and a side wall of the first HM layer 107b.

After the first HM layer 107b and the core layer (not shown) at the bottom of the first HM layer 107b are subsequently removed to form the second grooves, the first groove 400b and the second groove can also be isolated by the side wall layer 112b.

Subsequent steps are the same as those in the foregoing implementations, and details are not described herein again.

Correspondingly, FIG. 27 is a schematic diagram after an interconnection structure 121b is formed in an interconnection opening in a dielectric layer 115b. Adjacent interconnection structures 121b can still be isolated from each other, thereby preventing the interconnection structure 121b from short circuiting. Moreover, the pitch between adjacent interconnection structures 121b easily has the designed minimum space. In addition, the layout of the interconnection structure 121b can satisfy requirements of an IC design.

The present disclosure further provides a semiconductor structure. FIG. 12 and FIG. 13 are schematic structural diagrams of an embodiment of a semiconductor structure according to the present disclosure. FIG. 12 is a top view, and FIG. 13 is a sectional view in a direction AA1 in FIG. 12.

The semiconductor structure includes: a base 100; a to-be-etched material layer 101, located on the base 100; a core layer 111, located on the to-be-etched material layer 101, where a plurality of grooves 400 exposing the to-be-etched material layer 101 are formed in the core layer 111; a first HM layer 107, arranged discretely on the core layer 111, where a plurality of openings 200 are formed between adjacent first HM layers 107, the opening 200 and the groove 400 are in communication, and a side wall of the opening 200 is level with a side wall, located between adjacent first HM layers 107, of the groove 400; and a side wall layer 112, located on the side wall of the groove 400 and a side wall of the first HM layer 107.

In some implementations, a first groove is defined for the groove 400, and a subsequent process further includes: removing the first HM layer 107 and the core layer 111 at the bottom of the first HM layer 107, and forming, in the core layer 111, a plurality of second grooves exposing the to-be-etched material layer 101. Compared with a solution in which the first groove and the second groove are formed in a same step, in some implementations of the present disclosure, the first groove 400 and the second groove are separately formed, so that it is less difficult to form the first groove 400 and the second groove, and the process window is increased (for example, optical proximity effects are mitigated), thereby ensuring the pattern precision of the first groove 400 and the second groove. Correspondingly, the to-be-etched material layer 101 at the bottom of the first groove 400 and the second groove is subsequently removed, so that after a target pattern is formed in the remaining to-be-etched material layer 101, the pattern precision of the target pattern is also improved. Moreover, by using the side wall layer 112, the first groove 400 is isolated from the second groove, so that the pitch between the adjacent first groove 400 and second groove has the designed minimum space.

In addition, the core layer 111 exposed after the first HM layer 107 is subsequently removed is a region to be etched, so that it is less difficult to form the second groove, and the process window is increased.

The base 100 is used to provide a process platform for forming the semiconductor structure. In some implementations, for example, the semiconductor structure is a planar transistor, and the base 100 includes a substrate (not shown).

Specifically, the substrate is a silicon substrate. In other implementations, the material of the substrate may further be germanium, silicon-germanium, silicon carbide, gallium arsenide, indium gallium phosphide, among other materials. The substrate may further be another type of substrate such as a silicon-on-insulator substrate or a germanium-on-insulator substrate.

In other implementations, when the semiconductor structure is a fin field-effect transistor, the base may correspondingly include a substrate and a fin protruding from the substrate.

The base 100 may further include another structure such as a gate structure, a doped region, an STI structure, and a dielectric layer. The gate structure may be a metal gate structure or a polysilicon gate structure.

In some implementations, the base 100 further includes an inter-layer dielectric layer (not shown) located on the substrate and a contact hole plug (not shown) located in the inter-layer dielectric layer.

The to-be-etched material layer 101 is a material layer that subsequently needs to be patterned to form the target pattern.

In some implementations, the to-be-etched material layer 101 includes a dielectric layer 115 and a second HM material layer 116 located on the dielectric layer 115.

The dielectric layer 115 is used to electrically isolate subsequently formed interconnection structures.

In some implementations, the dielectric layer 115 is an IMD layer, to provide a process platform for subsequently forming metal interconnection structures. The dielectric layer 115 is further used to electrically isolate metal interconnection structures in a BEOL process.

In some implementations, the target pattern includes an interconnection opening located in the dielectric layer 115. The interconnection opening is used to provide a spatial position for forming interconnection structures. The interconnection opening has high pattern precision, and the formation quality and performance of the interconnection structures are significantly improved. While adjacent interconnection structures become less likely to short circuit, the pitch between the adjacent interconnection structures has the designed minimum space, thereby improving the performance and reliability of the semiconductor structure.

Specifically, the dielectric layer 115 is a first IMD layer used to electrically isolate first metal interconnection lines. The first metal interconnection line is a metal interconnection structure closest to a contact hole plug.

In other implementations, the dielectric layer may further be an IMD located on the first metal interconnection line and used to electrically isolate other interconnection structures. For example, the dielectric layer is a second IMD used to electrically isolate second metal interconnection lines and electrically isolate via structures located between the second metal interconnection line and the first metal interconnection line.

Accordingly, the material of the dielectric layer is a low k dielectric material, an ultra-low k dielectric material, silicon oxide, silicon nitride, silicon oxynitride or the like. In some implementations, the material of the dielectric layer is an ultra-low k dielectric material, to reduce a parasitic capacitance between BEOL metal interconnection structures, thereby reducing a BEOL RC delay. Specifically, the ultra-low k dielectric material may be SiOCH.

In other implementations, the dielectric layer may further be an inter-layer dielectric layer, to provide a process platform for subsequently forming a contact hole plug. The inter-layer dielectric layer is further used to isolate adjacent contact hole plugs and isolate the contact hole plug from a gate structure. Similarly, the target pattern includes a contact hole plug located in the inter-layer dielectric layer. The contact hole plug has relatively high pattern precision, and the formation quality and performance of the contact hole plug are correspondingly improved. While adjacent contact hole plugs become less likely to short circuit, the pitch between adjacent contact hole plugs has the designed minimum space, thereby improving the performance and reliability of the semiconductor structure.

The second HM material layer 116 forms a second HM layer after a subsequent patterning process is performed, to provide a mask for subsequently patterning the dielectric layer 115.

The material of the second HM material layer 116 may include one or more of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, and tungsten nitride.

In some implementations, the dielectric layer 115 is an IMD layer. Therefore, the second HM material layer 116 is an MHM material layer. Specifically, the material of the second HM material layer 116 is titanium nitride. The titanium nitride is a common MHM layer material in a BEOL process, and helps to improve the process compatibility.

The core layer 111 is further used to provide a process basis for subsequently forming the second groove.

The material of the core layer 111 may be silicon, silicon nitride, silicon oxide or titanium oxide. In some implementations, the material of the core layer 111 is silicon.

The first HM layer 107 is used to define a formation region for the subsequent second groove. A region between adjacent first HM layers 107 is further used to define a partial region of the first groove 400. Moreover, the first HM layer 107 is further used to provide a process platform for forming the side wall layer 112.

Accordingly, the topography, size, and formation position of the first HM layer 107 are determined according to the topographies, sizes, and formation positions of the first groove 400 and the second groove, that is, determined according to an IC design.

In some implementations, extension directions of the plurality of first HM layers 107 are the same, and in a direction perpendicular to the extension direction of the first HM layer 107, the plurality of first HM layers 107 are arranged in parallel.

The material of the first HM layer 107 is different from the material of the core layer 111. In some implementations, the material of the first HM layer 107 is silicon nitride. An etching selection ratio of silicon nitride to silicon is relatively large, so that it can be ensured that the first HM layer 107 can serve as an etching mask in a patterning process of forming the core layer 111.

In other implementations, the material of the first HM layer may alternatively be another material of which an etching selection ratio to the material of the core layer is relatively high.

It should be noted that the total thickness of the first HM layer 107 and the core layer 111 should neither be excessively small nor excessively large. If the total thickness is excessively small, the side wall layer 112 formed on the side walls of the first groove 400 and the first HM layer 107 is correspondingly excessively short, and the side wall layer 112 tends to fail to serve as an etching mask for subsequently patterning the to-be-etched material layer 101. If the total thickness is excessively large, process materials tend to be wasted. Moreover, correspondingly, it takes a relatively long time to remove the first HM layer 107 and the core layer 111 at the bottom of the first HM layer 107 subsequently, and production capacity may be reduced as a result. In addition, the first HM layer 107 and the core layer 111 at the bottom of the first HM layer 107 are further removed subsequently. If the total thickness is excessively large, correspondingly, the side wall layer 112 is excessively high as a result, and the side wall layer 112 is more likely to collapse. Accordingly, in some implementations, the total thickness of the first HM layer 107 and the core layer 111 is 400 angstroms to 1000 angstroms.

Specifically, in some implementations, to ensure subsequent normal pattern transfer and improve the precision of pattern transfer, the thickness of the first HM layer 107 is 200 angstroms to 700 angstroms, and the thickness of the core layer 111 is 200 angstroms to 700 angstroms.

The first groove 400 is used to provide a process platform for forming the side wall layer 112. The first groove 400 is further used to define a partial region to be etched in the to-be-etched material layer 101.

It should be noted that with reference to FIG. 12, in some implementations, for example, the top-view pattern of the first groove 400 is rectangular. An extension direction of the first groove 400 is the same as the extension direction (the direction X shown in FIG. 12) of the first HM layer 107. In the extension direction of the first HM layer 107, the length of the first groove 400 is greater than the length of the first HM layer 107. Moreover, the widths of the first groove 400 (in the direction Y shown in FIG. 12) are all equal.

However, the formation position, size, and topography of the first groove 400 are not only limited to the foregoing case. In other implementations, according to actual requirements of an IC design, the top-view pattern of the first groove may further have an irregular shape. For example, in the direction Y in FIG. 12, and compared with a part of the first groove located between adjacent first HM layers, the remaining first groove in another region has a larger width. Alternatively, two ends of adjacent first grooves are connected. That is, the first groove surrounds the first HM layer. After the first HM layer and the core layer at the bottom of the first HM layer are subsequently removed to form the second grooves, the first groove and the second groove can also be isolated by the side wall layer. Pattern transfer is performed subsequently to form an interconnection opening in the dielectric layer. After interconnection structures are formed in the interconnection opening, adjacent interconnection structures can also be isolated from each other, thereby preventing the interconnection structure from short circuiting.

The side wall layer 112 is used as a partial mask for subsequently forming the second groove in the core layer 111. The side wall layer 112 is further used as a partial mask for subsequently patterning the to-be-etched material layer 101.

The material of the side wall layer 112 may be titanium oxide, titanium nitride or silicon oxide. In some implementations, the material of the side wall layer 112 is titanium oxide. Etching selection ratios of titanium oxide to silicon, silicon nitride, and SiOCH are all relatively large, so that the side wall layer 112 can be kept in the subsequent step of removing the first HM layer 107 and the core layer 111 at the bottom of the first HM layer 107 to form the second groove, and the side wall layer 112 can be used as a partial mask for subsequently patterning the to-be-etched material layer 101.

In some implementations, the semiconductor structure further includes: an etch stop layer 114, located between the to-be-etched material layer 101 and the core layer 111, the etch stop layer 114 is further located on the to-be-etched material layer 101 exposed from the core layer 111.

The etch stop layer 114 is used to define an etch stop position in the step of patterning the core material layer to form the core layer 111 and the first groove 400 exposing the to-be-etched material layer 101, so as to protect the to-be-etched material layer 101. Moreover, the method subsequently further includes a step of removing the first HM layer 107 and the core layer 111 at the bottom of the first HM layer 107 to form a plurality of second grooves exposing the to-be-etched material layer 101. The etch stop layer 114 can also define an etch stop position in the step of forming the second groove, so that while it is ensured that the first groove 400 and the second groove can both expose the to-be-etched material layer 101, the loss of the to-be-etched material layer 101 is reduced.

In some implementations, the material of the etch stop layer 114 is silicon oxide. Selection ratios of silicon oxide to silicon nitride and silicon are both relatively high, so that it can be ensured that the etch stop layer 114 can define an etch stop position in the step of etching the core material layer to form the first groove 400 and the second groove.

In other implementations, according to the materials of the core layer, the side wall layer, and the to-be-etched material layer used in an actual process, the material of the etch stop layer may alternatively be another material of which selection ratios to the core layer, the side wall layer, and the to-be-etched material layer are relatively high, and is, for example, silicon nitride, silicon carbide, aluminum oxide or NDC.

FIG. 24 is a top view and is a schematic structural diagram of other implementations of a semiconductor structure according to the present disclosure.

For the same content in some implementations and the foregoing embodiment, details are not described herein again. A difference between some implementations and the foregoing embodiment lies in that the formation position, size, and topography of a first groove 400a are different from those in the foregoing embodiment.

Referring to FIG. 23, in a direction perpendicular to an extension direction of a first HM layer 107a, in a same first groove 400a, compared with a part located between adjacent first HM layers 107a, the remaining part has a larger width.

In some implementations, the first groove 400a is not only located between adjacent first HM layers 107a, but also in the extension direction of the first HM layer 107a, the first groove 400a extends to two sides of the first HM layer 107a, that is, the first groove 400a surrounds a part of a side wall of the first HM layer 107a, to satisfy actual requirements of an IC design.

After the first HM layer 107a and a core layer (not shown) at the bottom of the first HM layer 107a are subsequently removed to form the second grooves, the first groove 400a and a second groove can also be isolated by a side wall layer 112a.

Correspondingly, after an interconnection structure is subsequently formed in an interconnection opening in a dielectric layer (not shown), adjacent interconnection structures are isolated from each other, so as to prevent the interconnection structures from short circuiting. Moreover, the pitch between adjacent interconnection structures still easily has the designed minimum space. In addition, the layout of the interconnection structures can satisfy requirements of an IC design.

FIG. 27 is a top view and is a schematic structural diagram of still other implementations of a semiconductor structure according to the present disclosure.

For the same content in some implementations and the foregoing embodiment, details are not described herein again. A difference between some implementations described above and implementations described below lies in that the formation position, size, and topography of a first groove 400b are different from those in the implementations described above.

Referring to FIG. 27, in a direction perpendicular to an extension direction of a first HM layer 107b, after the first groove 400b exposing an etch stop layer 114b is formed, in a same first groove 400b, compared with a part located between adjacent first HM layers 107b, the remaining part has a larger width. Moreover, two ends of adjacent first grooves 400b are connected. That is, the first groove 400b surrounds the first HM layer 107b.

After the first HM layer 107b and the core layer (not shown) at the bottom of the first HM layer 107b are subsequently removed to form the second grooves, the first groove 400b and the second groove can also be isolated by a side wall layer 112b.

Correspondingly, after an interconnection structure is subsequently formed in an interconnection opening in a dielectric layer (not shown), adjacent interconnection structures are isolated from each other, so as to prevent the interconnection structures from short circuiting. Moreover, the pitch between adjacent interconnection structures still easily has the designed minimum space. In addition, the layout of the interconnection structures can satisfy requirements of an IC design.

The semiconductor structure may be formed using the forming method in the implementations described above or may be formed by using another forming method. Refer to corresponding description in the implementations described above for the detailed description of the semiconductor structure in the present implementations, and details are not described herein again in the present implementations.

The present disclosure is disclosed above, but the present disclosure is not limited thereto. Any person skilled in the art may make various variations and changes without departing from the spirit and scope of the present disclosure. Therefore, the protection scope of the present disclosure should be as defined by the claims.

What is claimed is:

1. A method for forming a semiconductor structure, comprising:
   providing a base;
   forming, on the base, a to-be-etched material layer, a core material layer located on the to-be-etched material layer, and a hard mask (HM) material layer located on the core material layer;
   patterning the HM material layer to form a plurality of discrete HM layers, wherein after the HM layers are formed, a plurality of openings is formed between adjacent HM layers;
   etching the core material layer between adjacent HM layers, forming, in the core material layer, a plurality of first grooves exposing the to-be-etched material layer, and using the remaining core material layer as a core layer, wherein the etching the core material layer between the adjacent HM layers comprises:
      forming a flattened layer on the core material layer exposed from the HM layer, wherein the flattened layer covers the top of the HM layer;
      forming a second pattern layer on the flattened layer, wherein the second pattern layer has a plurality of opening patterns, a side wall of an opening pattern located between adjacent HM layers is level with a side wall of the opening, or, an opening pattern located between adjacent HM layers exposes the flattened layer that is above the opening and is above a part of the top of HM layers on two sides of the opening; and
      sequentially etching the flattened layer and the core material layer along the opening pattern;
   forming a side wall layer on a side wall of the first groove and a side wall of the HM layer;
   after the side wall layer is formed, removing the HM layer and the core layer at the bottom of the HM layer, and forming, in the core layer, a plurality of second grooves exposing the to-be-etched material layer; and
   removing the to-be-etched material layer at the bottom of the first groove and the second groove by using the side wall layer and the remaining core layer as masks, and forming a target pattern in the remaining to-be-etched material layer.

2. The method for forming a semiconductor structure according to claim 1, wherein the step of patterning the HM material layer comprises:
forming a first pattern layer on the HM material layer; and
etching the HM material layer using the first pattern layer as a mask.

3. The method for forming a semiconductor structure according to claim 1, wherein the step of forming a side wall layer comprises:
forming a side wall material layer, wherein the side wall material layer conformally covers the bottom and the side wall of the first groove, the top and the side wall of the HM layer, and the top of the core layer exposed from the HM layer;
removing the side wall material layer located at the bottom of the first groove, the top of the HM layer, and the top of the core layer exposed from the HM layer, and keeping the remaining side wall material layer located on the side wall of the first groove and the side wall of the HM layer as the side wall layer.

4. The method for forming a semiconductor structure according to claim 3, wherein the side wall material layer is formed using an atomic layer deposition process or a chemical vapor deposition process.

5. The method for forming a semiconductor structure according to claim 3, wherein the side wall material layer located at the bottom of the first groove, the top of the HM layer, and the top of the core layer exposed from the HM layer is removed using a maskless dry etching process.

6. The method for forming a semiconductor structure according to claim 1, wherein:
the step of removing the HM layer and the core layer at the bottom of the HM layer comprises:
forming a passivation layer on the core layer exposed from the HM layer and the side wall layer and the to-be-etched material layer, wherein the passivation layer exposes the top of the HM layer; and
sequentially removing the HM layer and the core layer at the bottom of the HM layer using the passivation layer and the side wall layer as masks, and forming, in the core layer, the second grooves exposing the to-be-etched material layer; and
after the second grooves are formed, the method further comprises: removing the passivation layer.

7. The method for forming a semiconductor structure according to claim 6, wherein the material of the passivation layer is a spin-on-carbon (SOC) material, an organic dielectric layer (ODL) material, a bottom anti-reflective coating (BARC) material, a deep ultraviolet light absorbing oxide (DUO) material or a dielectric anti-reflective coating (DARC) material.

8. The method for forming a semiconductor structure according to claim 6, wherein the process of forming the passivation layer comprises a spin coating process.

9. The method for forming a semiconductor structure according to claim 1, wherein in the step of forming the HM material layer and the core material layer, the total thickness of the HM material layer and the core material layer is 400 angstroms to 1000 angstroms.

10. The method for forming a semiconductor structure according to claim 1, wherein in the step of forming the HM material layer, the thickness of the HM material layer is 200 angstroms to 700 angstroms; and in the step of forming the core material layer, the thickness of the core material layer is 200 angstroms to 700 angstroms.

11. The method for forming a semiconductor structure according to claim 1, wherein in the step of forming a side wall layer, the material of the side wall layer is titanium oxide, titanium nitride or silicon oxide.

12. The method for forming a semiconductor structure according to claim 1, wherein:
the to-be-etched material layer comprises a dielectric layer;
the step of forming a target pattern in the remaining to-be-etched material layer comprises: forming an interconnection opening in the dielectric layer; and
the forming method further comprises: forming an interconnection structure in the interconnection opening.

13. The method for forming a semiconductor structure according to claim 12, wherein the interconnection structure is a metal interconnection line or a contact hole plug.

* * * * *